United States Patent
Kim et al.

(10) Patent No.: US 11,194,655 B2
(45) Date of Patent: Dec. 7, 2021

(54) STORAGE CONTROLLER AND STORAGE DEVICE INCLUDING THE SAME

(71) Applicant: SAMSUNG ELECTRONICS CO., LTD., Suwon-si (KR)

(72) Inventors: Jihwan Kim, Suwon-si (KR); Inyoung Kim, Suwon-si (KR); Jonghwa Kim, Suwon-si (KR); Chanik Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 17 days.

(21) Appl. No.: 16/775,587

(22) Filed: Jan. 29, 2020

(65) Prior Publication Data
US 2020/0356438 A1 Nov. 12, 2020

(30) Foreign Application Priority Data
May 8, 2019 (KR) .......................... 10-2019-0053900

(51) Int. Cl.
| | |
|---|---|
| *G06F 11/10* | (2006.01) |
| *G06F 11/07* | (2006.01) |
| *G06F 11/30* | (2006.01) |
| *G06F 3/06* | (2006.01) |

(52) U.S. Cl.
CPC .......... *G06F 11/1044* (2013.01); *G06F 3/064* (2013.01); *G06F 3/0619* (2013.01); *G06F 3/0659* (2013.01); *G06F 3/0689* (2013.01); *G06F 11/0757* (2013.01); *G06F 11/1076* (2013.01); *G06F 11/3034* (2013.01); *G06F 11/3058* (2013.01)

(58) Field of Classification Search
CPC .................................................... G06F 11/1044
USPC .......................................................... 714/6.2
See application file for complete search history.

(56) References Cited

U.S. PATENT DOCUMENTS

| | | | |
|---|---|---|---|
| 8,644,099 B2 | 2/2014 | Cometti et al. | |
| 8,650,353 B2 | 2/2014 | Belgal et al. | |
| 9,443,603 B2 | 9/2016 | Kim | |
| 9,595,320 B2 | 3/2017 | Wu et al. | |
| 9,812,210 B2 | 11/2017 | Zeng et al. | |
| 2010/0138588 A1 | 6/2010 | Lin et al. | |
| 2012/0210076 A1 | 8/2012 | Jang et al. | |
| 2012/0239976 A1* | 9/2012 | Cometti | G11C 16/10 714/24 |

(Continued)

FOREIGN PATENT DOCUMENTS

KR  10-2015-0107399  9/2015

*Primary Examiner* — Fritz Alphonse
(74) *Attorney, Agent, or Firm* — F. Chau & Associates, LLC

(57) ABSTRACT

A storage device includes a non-volatile memory including a plurality of memory blocks and a storage controller configured to control a read operation of the non-volatile memory. The storage controller receives power-off time information indicating a power-off time point at which the storage device is powered off, and power-on time information indicating a power-on time point at which the storage device is powered on, when the storage device is switched from a power-off state to a power-on state. The storage controller stores a power-off time stamp corresponding to the power-off time point and a power-on time stamp corresponding to the power-on time point in the non-volatile memory.

20 Claims, 15 Drawing Sheets

(56) References Cited

U.S. PATENT DOCUMENTS

| | | | |
|---|---|---|---|
| 2013/0060994 A1* | 3/2013 | Higgins | G06F 12/0246 |
| | | | 711/103 |
| 2015/0262697 A1* | 9/2015 | Kim | G11C 16/32 |
| | | | 711/103 |
| 2017/0131924 A1* | 5/2017 | Main | G06F 3/0679 |
| 2017/0271020 A1* | 9/2017 | Zeng | G06F 11/076 |

\* cited by examiner

| ELAPSED TIME IN POWER_ON PERIOD | △READ LEVEL |
|---|---|
| T1a | V1a |
| T2a | V2a |
| ⋮ | ⋮ |
| Tka | Vka |

LUTa

STORAGE CONTROLLER AND STORAGE DEVICE INCLUDING THE SAME

CROSS-REFERENCE TO RELATED APPLICATION

This U.S. non-provisional patent application claims the benefit of priority under 35 U.S.C. § 119 to Korean Patent Application No. 10-2019-0053900, filed on May 8, 2019, in the Korean Intellectual Property Office, the disclosure of which is incorporated by reference in its entirety herein.

BACKGROUND

1. Technical Field

The inventive concept relates to a storage device, and more particularly, to a storage controller and a storage device including the same.

2. Discussion Related Art

As a non-volatile memory such as a flash memory may retain stored data even when power is interrupted. Storage devices including flash memories like an embedded multimedia card (eMMC), a universal flash storage (UFS), a solid state drive (SSD), and a memory card are being widely used. Such storage devices are useful for storing or transporting a large amount of data. A flash memory stores data by changing threshold voltages of memory cells and reads data by using a pre-set read level. However, degradation of the memory cells may change the threshold voltages of the memory cells, thereby causing read errors. Therefore, the reliability of a such storage device needs to be improved.

SUMMARY

At least one embodiment of the inventive concept provides a storage controller capable of improving the reliability of a read operation of a storage device and a storage device including the same.

According to an exemplary embodiment of the inventive concept, there is provided a storage device including: a non-volatile memory including a plurality of memory blocks; and a storage controller configured to control a read operation of the non-volatile memory. The storage controller receives power-off time information indicating a power-off time point at which the storage device is powered off, and receives power-on time information indicating a power-on time point at which the storage device is powered on, when the storage device is switched from a power-off state to a power-on state. The storage controller stores a power-off time stamp corresponding to the power-off time point and a power-on time stamp corresponding to the power-on time point in the non-volatile memory.

According to an exemplary embodiment of the inventive concept, there is provided a storage device including: a non-volatile memory including a plurality of memory blocks; and a storage controller configured to control a read operation of the non-volatile memory by using at least one read level. The storage controller receives power-off time information indicating a time point at which the storage device is powered off, and receives power-on time information indicating a time point at which the storage device is powered on, from an external source, and controls the read operation by using a power-off period calculated based on the power-off time information and the power-on time information.

According to an exemplary embodiment of the inventive concept, there is provided a storage controller: including a memory configured to store a power-off time stamp, a power-on time stamp, and a read level look-up table including information indicating read levels according to power-off periods; and a processor configured to control a read operation of a non-volatile memory. The processor stores the power-off time stamp by using input power-off time information indicating a power-off time point, and stores the power-on time stamp by using input power-on time information indicating a power-on time point, and controls the read operation of the non-volatile memory using a power-off period calculated based on the power-off time stamp and the power-on time stamp and the read level look-up table.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXEMPLARY EMBODIMENTS

Figure 1:
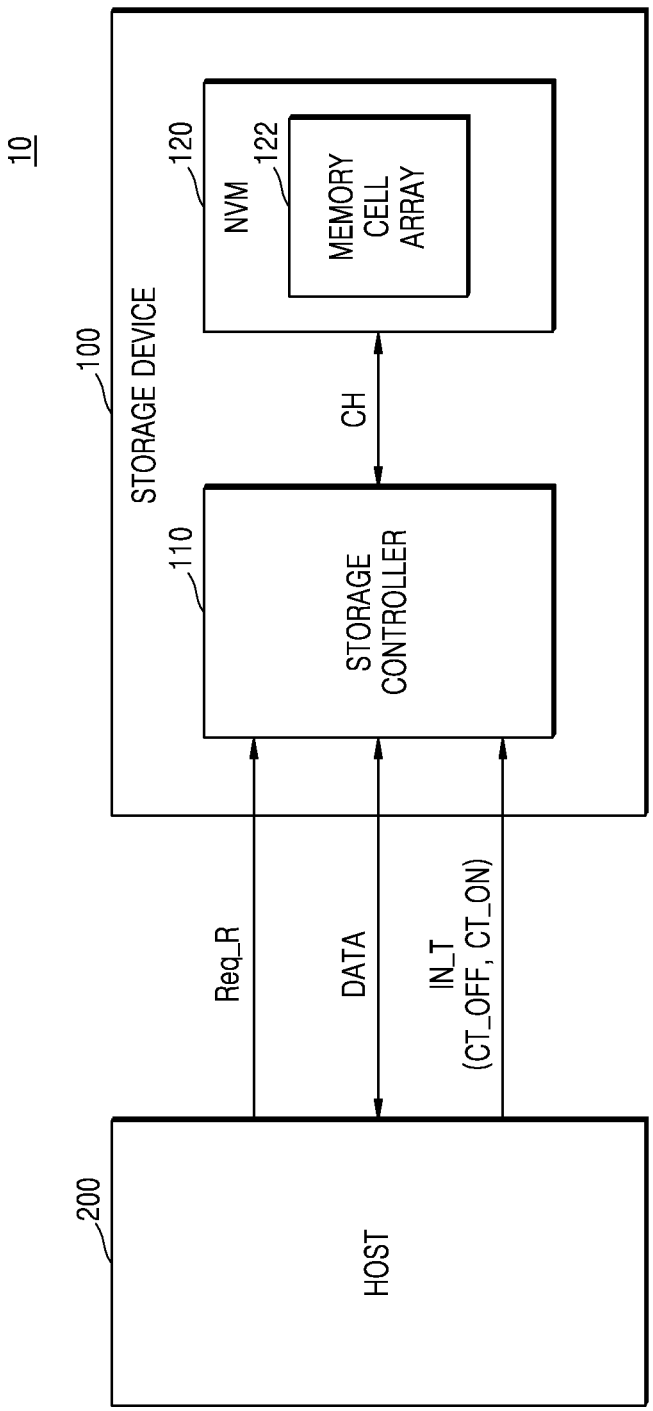
FIG. 1 is a block diagram showing a storage system according to an exemplary embodiment of the inventive concept.

FIG. 1 is a block diagram showing a storage system according to an example embodiment of the inventive concept.

Referring to FIG. 1, a storage system 10 includes a storage device 100 and a host 200. The host 200 (e.g., a host device) may control the operation of the storage device 100.

In an exemplary embodiment, the storage device 100 includes one or more solid state drives (SSD). When the storage device 100 includes an SSD, the storage device 100 may include a plurality of flash memory chips (e.g., NAND memory chips) for storing data.

The storage device 100 may correspond to a flash memory device including one or more flash memory chips. In an exemplary embodiment, the storage device 100 is an embedded memory included in the storage system 10. For example, the storage device 100 may be an embedded multi-media card (eMMC) or an embedded universal flash storage (UFS) memory device. In an exemplary embodiment, the storage device 100 is an external memory detachably attached to the storage system 10. For example, the storage device 100 may be a UFS memory card, a compact flash (CF) card, a secure digital (SD) card, a micro secure digital (SD) card, a mini secure digital (SD) card, an extreme digital (xD) card, or a memory stick.

The storage device 100 receives time information IN_T from the host 200. The time information IN_T may include information regarding the time at which an operation is performed. The storage device 100 may receive the time information IN_T as data from the host 200 and may also receive the time information IN_T as a request.

In an exemplary embodiment, the storage device 100 stores a time stamp TS based on received time information IN_T. In an exemplary embodiment, the storage device 100 stores the time stamp TS in a non-volatile memory 120. Alternatively, the storage device 100 may store the time stamp TS in a memory inside the storage controller 110.

In an exemplary embodiment, the time information IN_T includes power-off time information CT_OFF, which is information indicating a time when the storage device 100 is powered off, and power-off time information CT_ON, which is information indicating a time when the storage device 100 is powered on. In an embodiment, the host 200 provides the power-off time information CT_OFF and the power-on time information CT_ON together to the storage device 100 after switching the storage device 100 from a power-off state to a power-on state.

The storage device 100 may calculate a power-off period during which the storage device 100 was powered off based on the power-off time information CT_OFF and the power-on time information CT_ON. The storage device 100 may store a read level look-up table (e.g., LUT of FIG. 2) including information indicating read levels according to different power-off periods and may determine a read level for a read operation based on the read level look-up table. In an alternate embodiment, the host 200 provides the power-off period to the storage device 100 after switching the storage device 100 from a power-off state to a power-on state. Thus, in the alternate embodiment, the storage device 100 does not need to calculate the power-off period.

As a period during which no power is supplied to the storage device 100, that is, the power-off period increases, memory cells of the non-volatile memory 120 may be degraded and the threshold voltage distribution of the degraded memory cells may be changed. The storage device 100 according to an exemplary embodiment the inventive concept may calculate a power-off period based on the power-off time information CT_OFF and the power-on time information CT_ON. The storage device 100 may adjust a read level for reading data according to the power-off period, thereby reducing read errors. Also, when the storage device 100 is powered on, a read level may be determined by calculating a power-off period without performing an operation (e.g., a read retry operation) for providing read voltages having different read levels to the memory cells of non-volatile memory 120 to detect an appropriate read level, and thus the time elapsed from power-on to a read operation may be reduced.

The storage device 100 may detect old data from data stored in a memory cell array 122 of the non-volatile memory 120 based on the power-off time information CT_OFF and the power-on time information CT_ON. When a time equal to or longer than a reference time is elapsed after programming data to the storage device, the storage device 100 may determine that the programmed data is old data, that is, invalid data. The storage device 100 may perform a read reclaim operation on a memory block including old data. Therefore, the storage device 100 may determine invalid data without performing an error correcting operation or a redundant array of inexpensive disk (RAID) recovery operation and may reduce the time elapsed for the read reclaim operation. For example, if data is programmed to a first memory block of the memory 120 and an amount of time elapses that exceeds the reference time before the storage device 100 is powered off, the data of the first memory block may be considered invalid, and then a reclaim operation can copy valid data of the first memory block to a free second block and erase the first memory block. If the amount of elapsed time does not exceed the reference time when the storage device 100 is powered off, the elapsed time may be added to a power-off period determined from CT_OFF and CT_ON when the storage device 100 is powered on to generate a sum, and if the sum exceeds the reference time, the data of the first memory block may be considered invalid, and then a reclaim operation can copy valid data of the first memory block to a free second block and erase the first memory block.

The storage device 100 may include the storage controller 110 (e.g., a control circuit) for controlling the overall operation of the storage device 100 and the non-volatile memory 120 for storing data. The storage device 100 may store the data DATA or read the data DATA in response to a memory access request from the host 200. Also, the storage device 100 may receive a logical address from the host 200 and access the data DATA in a physical area corresponding to the logical address. For example, when a request from the host 200 corresponds to a read request Req_R, the storage device 100 may output read data DATA to the host 200 in response to the request. For example, the storage controller 110 may convert the logical address to a physical address of the memory device 120.

The storage controller 110 may control the operation of the non-volatile memory 120 through a channel CH. The storage controller 110 may receive the read request Req_R and a logical address from the host 200 and read the data DATA written to the non-volatile memory 120 through the channel CH.

The non-volatile memory 120 may include the memory cell array 122. In an example embodiment, the memory cell array 122 may include flash memory cells. For example, the flash memory cells may be NAND flash memory cells. However, the inventive concept is not limited thereto, and the memory cells may be resistive memory cells like resistive RAM (ReRAM) cells, phase change RAM (PRAM) cells, and magnetic RAM (MRAM) cells.

Figure 2:
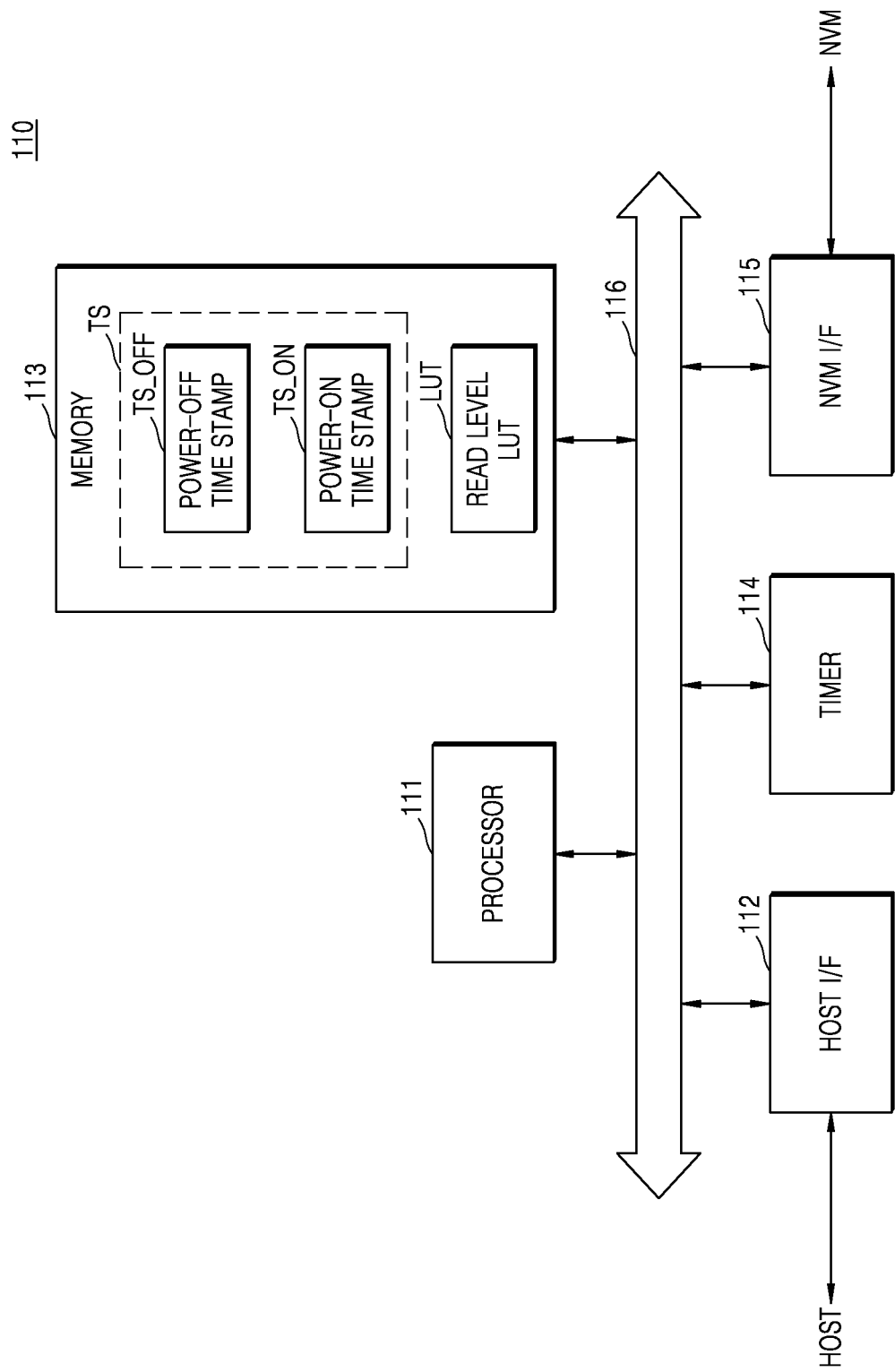
FIG. 2 is a block diagram showing an example configuration of a storage controller of FIG. 1 according to an exemplary embodiment of the inventive concept.

FIG. 2 is a block diagram showing a storage controller of FIG. 1 according to an exemplary embodiment of the inventive concept.

Referring to FIGS. 1 and 2, the storage controller 110 includes a processor 111, a host interface 112, a memory 113, a timer 114, and a non-volatile memory interface 115. The above-stated components may communicate with one another via a bus 116, and the storage controller 110 may further include other peripheral devices.

The processor 111 may control the overall operation of the storage controller 110. The processor 111 may include a central processing unit or a microprocessor. The processor 111 may execute firmware for driving the storage controller 110. The firmware may be loaded to the memory 113 and executed.

The host interface 112 may perform communication with the host 200. For example, the host interface 112 may provide a physical connection between the host 200 and the storage device 100. The host interface 112 may adjust the size of data exchanged with the storage device 100 or convert the format of a command to be exchanged in correspondence to a bus format of the host 200. In an example embodiment, the host interface 112 may include a universal serial bus (USB), a multimedia card (MMC), a PCI Express (PCI-E), an AT attachment (ATA), a serial AT attachment (SATA), a parallel AT attachment (PATA), a small computer system interface (SCSI), a serial attached SCSI (SAS), an enhanced small disk interface (ESDI), and an integrated drive electronics (IDE).

The memory 113 may be operated under the control of the processor 111. The memory 113 may be used as an operation memory, a cache memory, or a buffer memory of the processor 111. Software for controlling the storage controller 110, i.e., firmware, may be loaded to the memory 113. The memory 113 may be implemented by a volatile memory such as dynamic random access memory (DRAM) or static random access memory (SRAM). Alternatively, the memory 113 may be implemented by a non-volatile memory such as flash memory, resistive random access memory (RRAM), phase-change random access memory (PRAM), or magnetic random access memory (MRAM).

In an exemplary embodiment, the memory 113 stores a read level look-up table LUT that includes information indicating a time stamp TS and a read level according to the power-off period of the storage device 100 that may be derived from the time stamp TS. In an example embodiment, the time stamp TS and the read level look-up table LUT may be read from the non-volatile memory 120 and temporarily stored in the memory 113. Alternatively, the time stamp TS and the read level look-up table LUT may be stored in a separate memory 113 included in the storage controller 110.

In an exemplary embodiment, the time stamp TS includes a power-off time stamp TS_OFF corresponding to a time point at which the storage device 100 is powered off and a power-on time stamp TS_ON corresponding to a time point at which the storage device 100 is powered on. The processor 111 may determine a read level of the non-volatile memory 120 based on the time stamp TS and the read level look-up table LUT stored in the memory 113. For example, the processor 111 may determine a read level of the non-volatile memory 120 based on a power-off time stamp, a power-on time stamp, and the read level look-up table LUT stored in the memory 113.

The timer 114 may provide internal time information for the operation of the storage controller 110 to the processor 111. The timer 114 may generate an internal current time by counting internal clock signals. For example, may count pulses of an internal clock signal to generate the current time. The internal clock signals may be generated by an oscillator within the storage device 100. The timer 114 may be implemented by hardware (e.g., a timer circuit). However, the inventive concept is not limited thereto as the timer 114 may instead be implemented by software or firmware.

In an exemplary embodiment, the timer 114 is reset when the storage device 100 is powered off, and the timer 114 may newly sets internal time information when the storage device 100 is switched from the power-off state to the power-on state. In an exemplary embodiment, the timer 114 sets new internal time information that reflects a power-off period by using the power-off time stamp TS_OFF and the power-on time stamp TS_ON. Alternatively, the timer 114 may set new internal time information reflecting a power-off period by using the power-off time information CT_OFF and the power-on time information CT_ON.

A non-volatile memory interface 115 may exchange the data DATA with the non-volatile memory 120. The non-volatile memory interface 115 may transmit a read level control signal (e.g., CTRL_R in FIG. 3) for changing a read level for a read operation through the channel CH to the non-volatile memory 120.

The storage controller 110 may further include an error correction code (ECC) circuit and a RAID recovery circuit. The ECC may perform an error correction operation using an ECC parity on data of an error correction unit. The RAID recovery circuit may perform a RAID recovery using data constituting a RAID stripe and a RAID parity. In an exemplary embodiment, the RAID recovery circuit may perform a RAID recovery based on an XOR operation using data and a RAID parity.

Figure 3A:
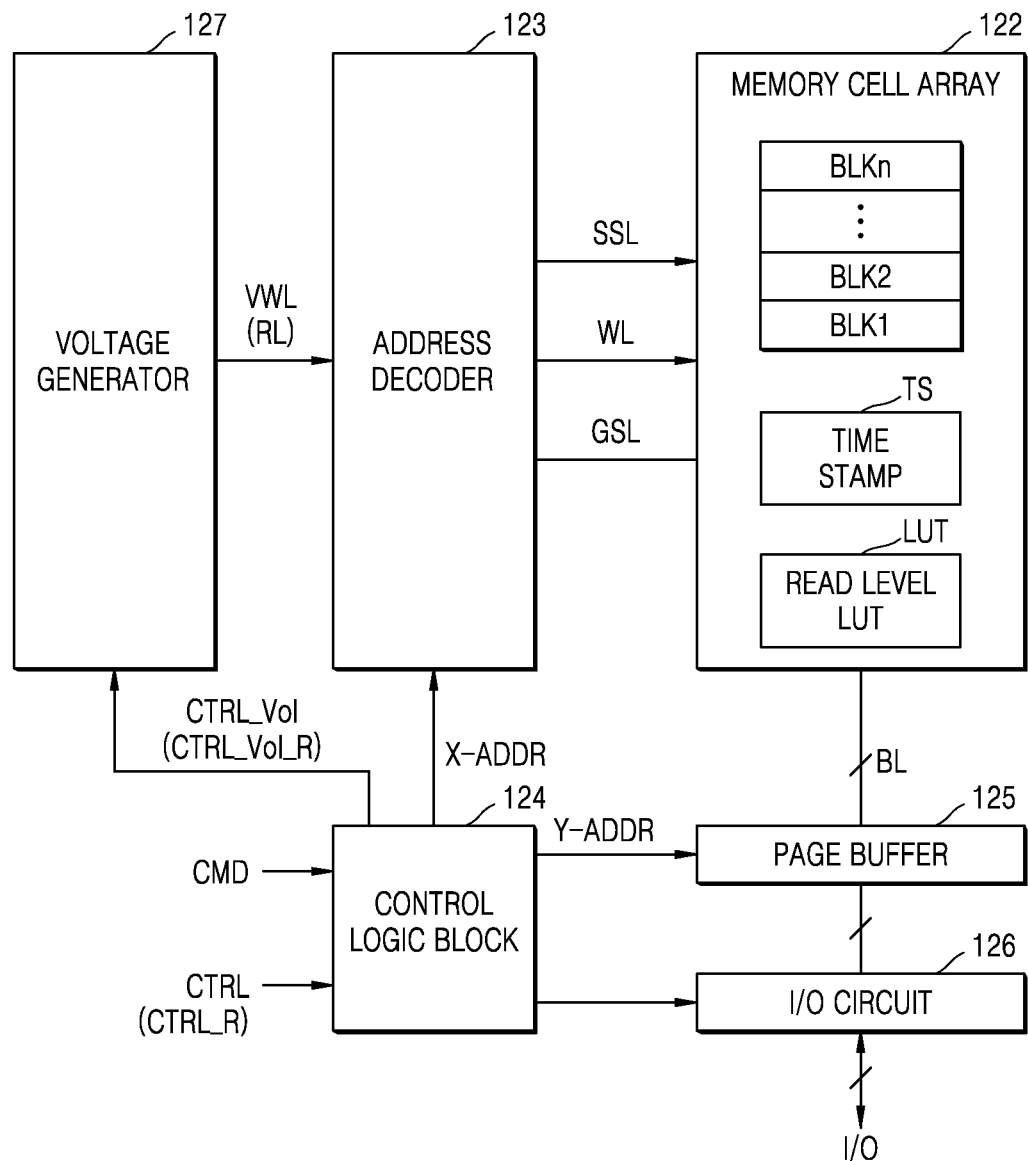
FIGS. 3A and 3B are block diagrams showing a non-volatile memory of FIG. 1 according to an exemplary embodiment of the inventive concept.
Figure 3B:
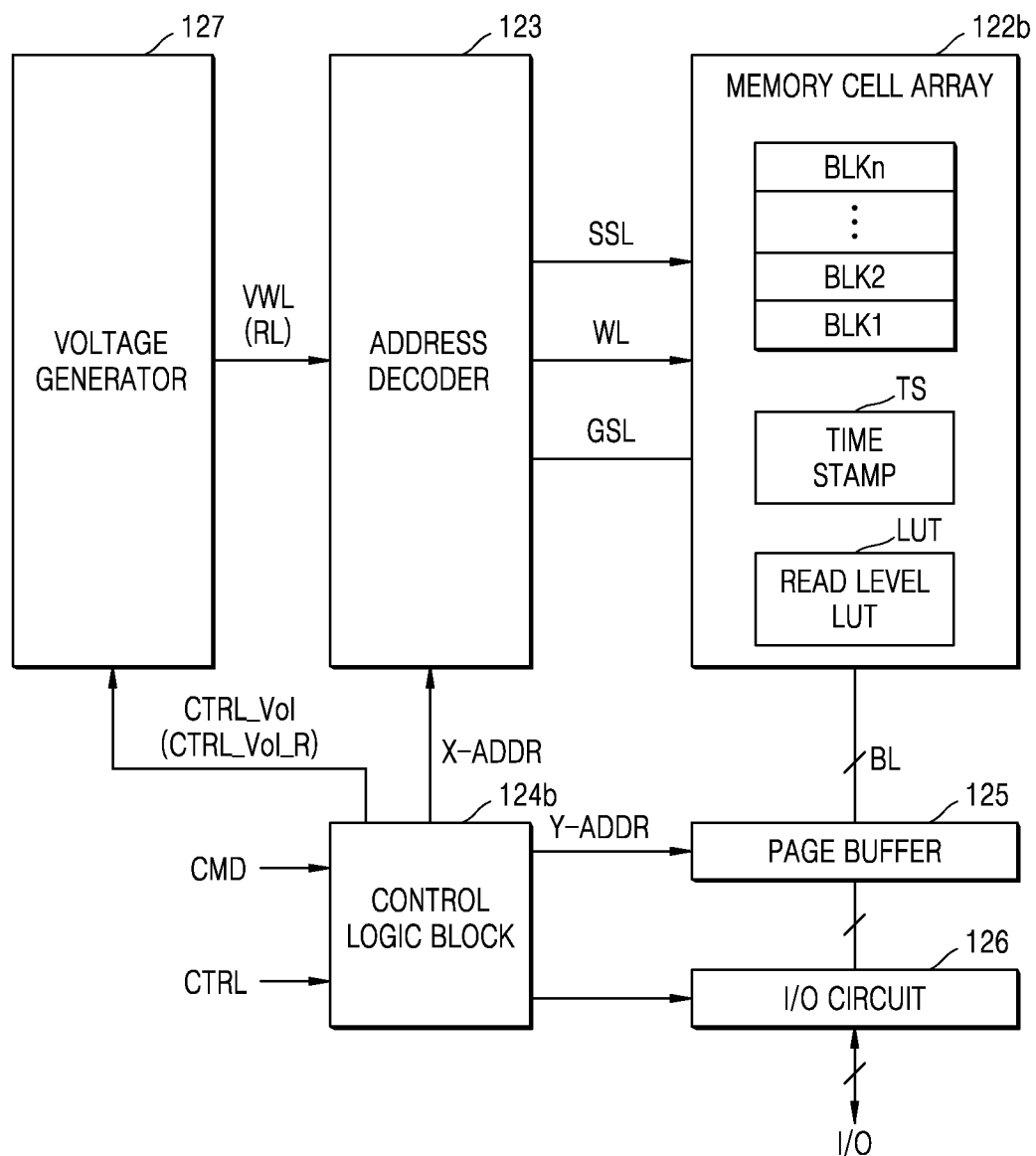

FIGS. 3A and 3B are block diagrams showing a non-volatile memory of FIG. 1 according to exemplary embodiments of the inventive concept.

Referring to FIG. 3A, the non-volatile memory 120 includes a memory cell array 122, an address decoder 123 (e.g., a decoding circuit), a control logic block 124 (e.g., a control circuit), a page buffer 125, an input/output circuit 126, and a voltage generator 127. The non-volatile memory 120 may further include an input/output interface.

The memory cell array 122 may be connected to word lines WL, string select lines SSL, ground select lines GSL, and bit lines BL. The memory cell array 122 may be connected to the address decoder 123 through the word lines WL, the string select lines SSL, and the ground select lines GSL and may be connected to the page buffer 125 through the bit lines BL. The memory cell array 122 may include a plurality of memory blocks BLK1 to BLKn.

Each of the memory blocks BLK1 to BLKn may include a plurality of memory cells and a plurality of select transistors. Memory cells may be connected to the word lines WL, and select transistors may be connected to the string select lines SSL or the ground select lines GSL. The memory cells of each of the memory blocks BLK1 to BLKn may be single level cells each storing 1-bit data or multi-level cells each storing M-bit data (M is 2 or a greater integer).

The address decoder 123 may select one of a plurality of memory blocks BLK1 to BLKn of the memory cell array 122, may select one of the word lines WL of a selected memory block, and may select one of the select lines SSL.

The memory cell array 122 may store the read level look-up table LUT that includes the time stamp TS and information indicating a read level corresponding to a power-off period of a storage device. The time stamp TS may include a power-off time stamp indicating a time point at which the storage device is powered off and a power-on time stamp indicating a time point at which the storage device is powered on. For example, information indicating read levels of corresponding power-off periods may be stored in the memory cell array 122 in a look up table LUT. The memory cell array 122 may include distinct first, second, and third regions, where the first region includes the memory blocks BLK1 to BLKn, the second region includes the time stamp TS, and the third region includes the LUT.

The control logic block 124 may output various control signals for performing program, read, and erase operations on the memory cell array 122 based on a command CMD, an address ADDR, and a control signal CTRL. The control logic block 124 may provide a row address X-ADDR to the address decoder 123, provide a column address Y-ADDR to the page buffer 125, and provide a voltage control signal CTRL_Vol to the voltage generator 127.

In an exemplary embodiment, the control logic block 124 receives a read level control signal CTRL_R from a storage controller (e.g., 110 of FIG. 2). The read level control signal CTRL_R may be a control signal to change a read level by considering the threshold voltage distribution of memory cells that varies as a storage device is powered off. The control logic block 124 may provide a read voltage control signal CTRL_Vol_R to the voltage generator 127 based on the read level control signal CTRL_R. For example, the voltage generator 127 changes a level of a read voltage R according to the read level control signal CTRL_R.

The page buffer 125 may operate as a write driver or a sense amplifier depending on an operation mode. During a read operation, the page buffer 125 may sense a bit line BL of a selected memory cell under the control of the control logic block 124. Sensed data may be stored in latches provided in the page buffer 125. The page buffer 125 may dump data stored in the latches to the input/output circuit 126 under the control of the control logic block 124.

The input/output circuit 126 may temporarily store the command CMD, the address ADDR, the control signal CTRL, and the data DATA provided from outside of the non-volatile memory 120 through an input/output line I/O. The input/output circuit 126 may temporarily store read data of data read from the non-volatile memory 120 and output the read data to the outside through the input/output line I/0 at a designated time point.

The voltage generator 127 may generate various types of voltages for performing a program operation, a read operation, and an erase operation on the memory cell array 122 based on the voltage control signal CTRL_Vol. In detail, the voltage generator 127 may generate a word line voltage VWL, e.g., a program voltage, a read voltage, a pass voltage, an erase verify voltage, or a program verify voltage. Also, the voltage generator 127 may generate a string select line voltage and a ground select line voltage based on the voltage control signal CTRL_Vol. The voltage generator 127 may generate an erase voltage to be provided to the memory cell array 122.

In an exemplary embodiment, the voltage generator 127 receives the read voltage control signal CTRL_Vol_R and generates a read voltage RL for performing a read operation on the memory cell array 122 after a storage device is switched from the power-off state to the power-on state. For example, a level of the read voltage RL may vary based on a state of the read voltage control signal CTRL_Vol_R.

Referring to FIG. 3B, a non-volatile memory 120b include a memory cell array 122b, the address decoder 123, a control logic block 124b, the page buffer 125, the input/output circuit 126, and the voltage generator 127.

The memory cell array 122b may store the time stamp TS and the read level look-up table LUT. The time stamp TS may include a power-off time stamp corresponding to a time point at which the storage device is powered off and a power-on time stamp corresponding to a time point at which the storage device is powered on.

Unlike the embodiment of FIG. 3A in which a storage controller (e.g., 110 of FIG. 2) calculates a read level, in the embodiment of FIG. 3B, the control logic block 124b determines the read level of the non-volatile memory 120b based on the time stamp TS and the read level look-up table LUT stored in the memory cell array 122b. The control logic block 124b may calculate the power-off period of the non-volatile memory 120b based on the time stamp TS and determine a read level corresponding to a calculated power-off period based on the read level look-up table LUT. The control logic block 124b may provide the read voltage control signal CTRL_Vol_R according to a determined read level to the voltage generator 127.

Figure 4:
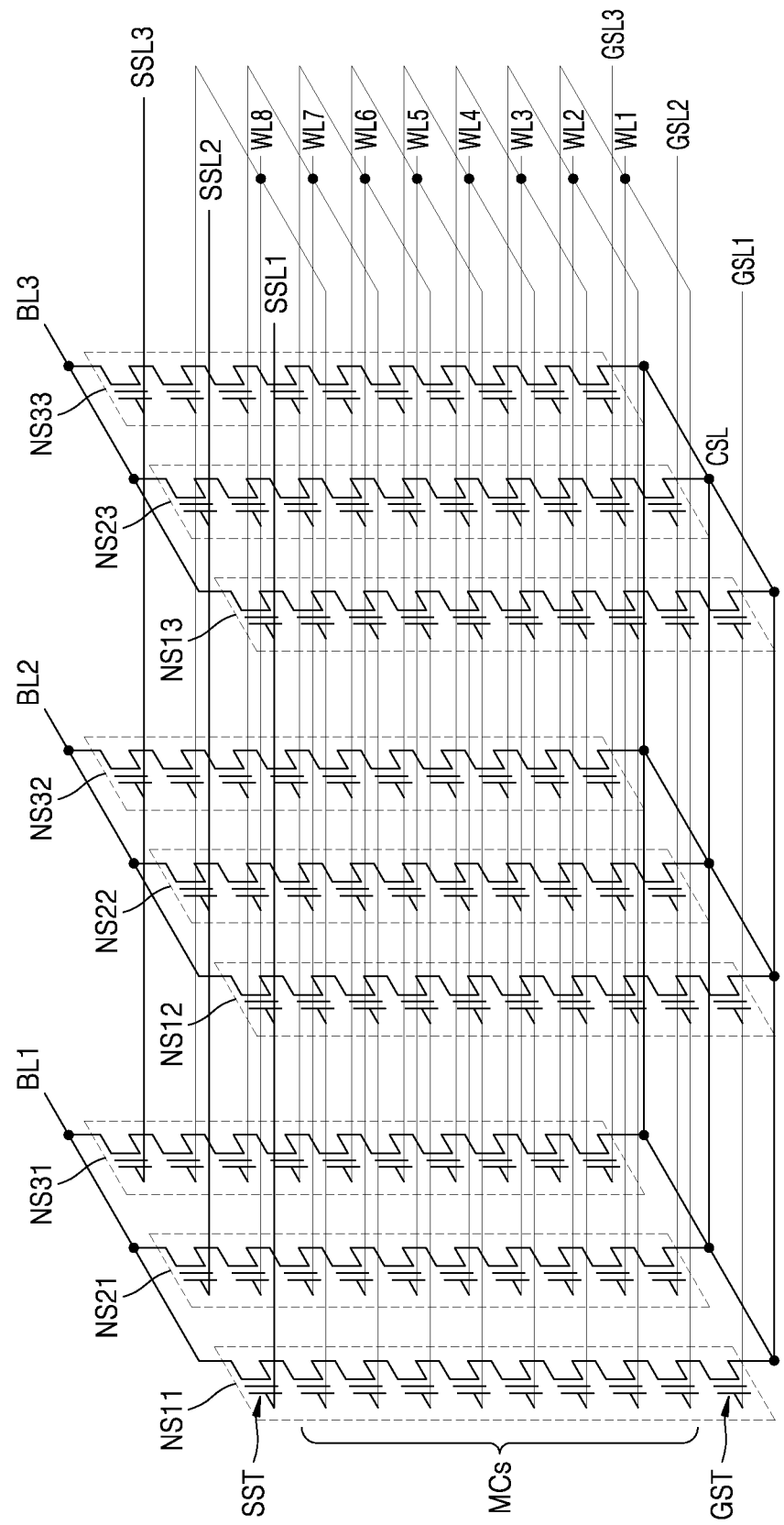
FIG. 4 is an equivalent circuit diagram of a first memory block of FIGS. 3A and 3B.

FIG. 4 is an equivalent circuit diagram of a first memory block of FIGS. 3A and 3B.

Referring to FIG. 4, a first memory block BLK1 may include NAND strings NS11 to NS33, word lines WL1 to WL8, bit lines BL1 to BL3, ground select lines GSL1 to GSL3, string select lines SSL1 to SSL3, and a common source line CSL. Each NAND string (e.g., NS11) may include a string select transistor SST, a plurality of memory cells MCs, and a ground select transistor GST that are connected in series. The string select transistor SST is connected to a corresponding string select line SSL1. The ground select transistor GST is connected to a corresponding ground select line GSL1. The string select transistors SST are respectively connected to corresponding bit lines BL1 to BL3, and the ground select transistor GST is connected to the common source line CSL.

NAND strings NS11, NS12, and NS13 of a first row from among the NAND strings NS11 to NS33 are connected in common to a first string select line SSL1 and may constitute a first plane. NAND strings NS21, NS22, and NS23 of a second row are connected in common to a second string select line SSL2 and may constitute a second plane. NAND strings NS31, NS32, and NS33 of a third row are connected in common to a third string select line SSL3 and may constitute a third plane. In the present embodiment, the first memory block BLK1 shows three planes connected to three bit lines BL1 to BL3.

The memory cells MCs are connected to corresponding word lines WL1 to WL8, respectively. A set of the memory cells MCs that are connected to one word line and simultaneously programmed are referred to as a page. The first memory block BLK1 may include a plurality of pages. In an example embodiment, a plurality of pages may be connected to one word line, and a word line (e.g., WL4) at the same height as that of the common source line CSL may be commonly connected to three pages.

Each memory cell MC may store one bit of data or two or more bits of data.

The numbers of rows and columns of NAND strings illustrated in the first memory block BLK1 of FIG. 4 may be increased or decreased. As the number of rows of NAND strings changes, the number of planes may change. As the number of columns of NAND strings changes, the number of bit lines connected to the columns of NAND strings and the number of NAND strings connected to one string select line may also change. The height of NAND strings may be increased or decreased. For example, the number of memory cells stacked on each NAND string may be increased or decreased.

Figure 5:
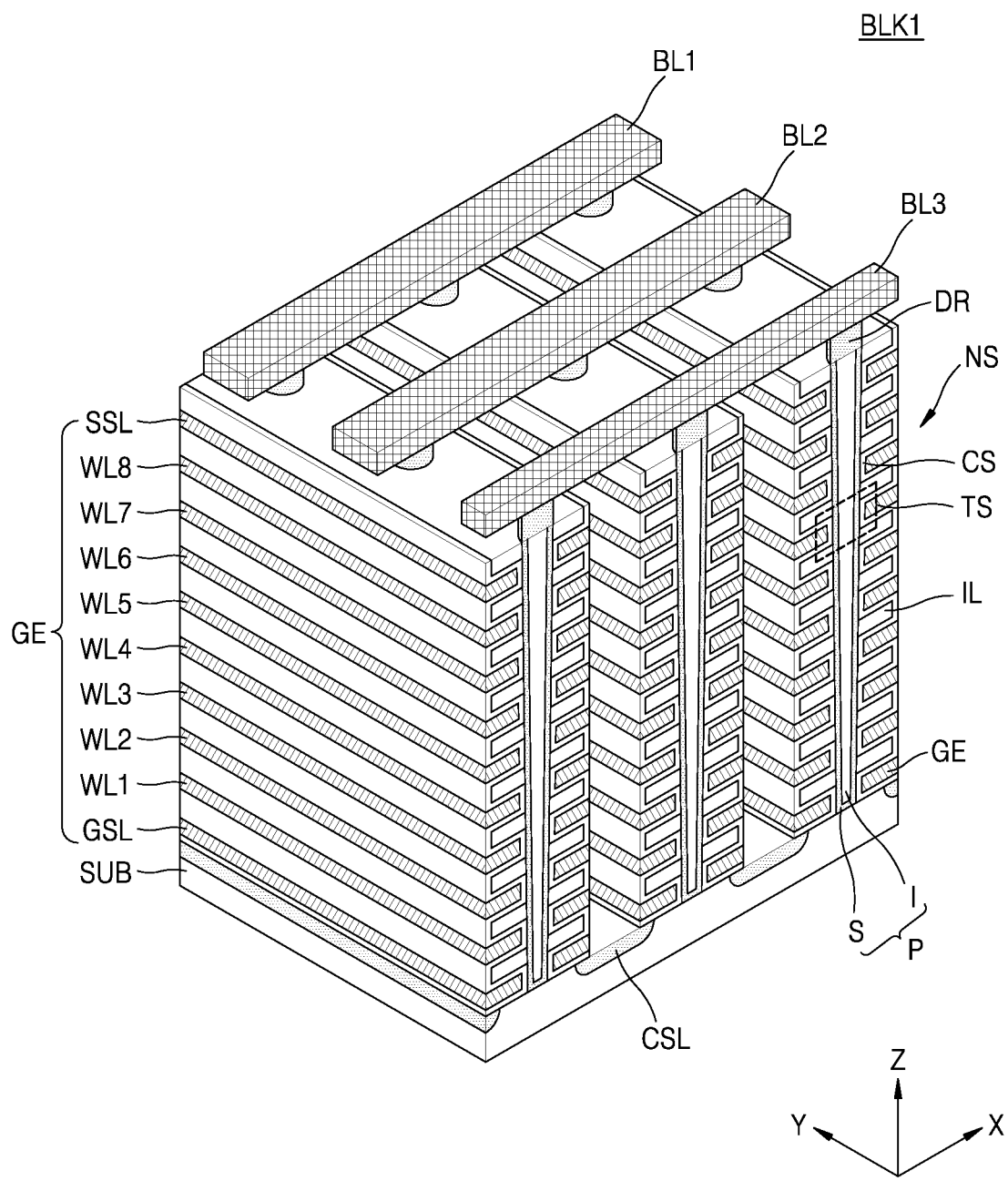
FIG. 5 is a perspective view of an example of the first memory block of FIGS. 3A and 3B.

FIG. 5 is a perspective view of an example of the first memory block BLK1 of FIGS. 3A and 3B.

Referring to FIG. 5, the first memory block BLK1 may be disposed in a direction perpendicular to a substrate SUB. The substrate SUB has a first conductivity type (e.g., p type), and common source lines CSL that extend in a first direction y and are doped with impurities of a second conductivity type (e.g., n type) are provided in the substrate SUB. Insulation films IL extending in a first direction y are sequentially provided in a third direction z on a region of the substrate SUB between two adjacent common source lines CSL, and the insulation films IL may be a certain distance apart from each other in the third direction z. Pillars P, which are sequentially arranged in the first direction y and penetrate through the insulation films IL in the third direction z, may be provided on the region of the substrate SUB between two adjacent common source lines CSL. For example, the pillars P may contact the substrate SUB by penetrating through the insulation films IL. In detail, a surface layer S of each pillar P may include a silicon-based material doped with impurities of the first conductivity type and function as a channel region. On the other hand, an internal layer I of each pillar P may include an insulating material like silicon oxide or an air gap.

A charge storage layer CS may be provided along exposed surfaces of the insulation films IL, the pillars P, and the substrate SUB in the region between the two adjacent common source lines CSL. The charge storage layer CS may include a tunneling insulation layer, a charge trapping layer, and a blocking insulation layer. Also, gate electrodes GE like selected gate lines GSL and SSL and the word lines WL1 through WL8 may be provided on an exposed surface of the charge storage layer CS in the region between the two adjacent common source lines CSL. Drain contacts DR may be provided on the pillars P, respectively. For example, the drain contacts DR may include a silicon-based material doped with impurities of the second conductivity type. Bit lines BL1 to BL3 extending in a second direction x and being a certain distance apart from one another in the first direction y may be provided on the drain contacts DR.

Figure 6:
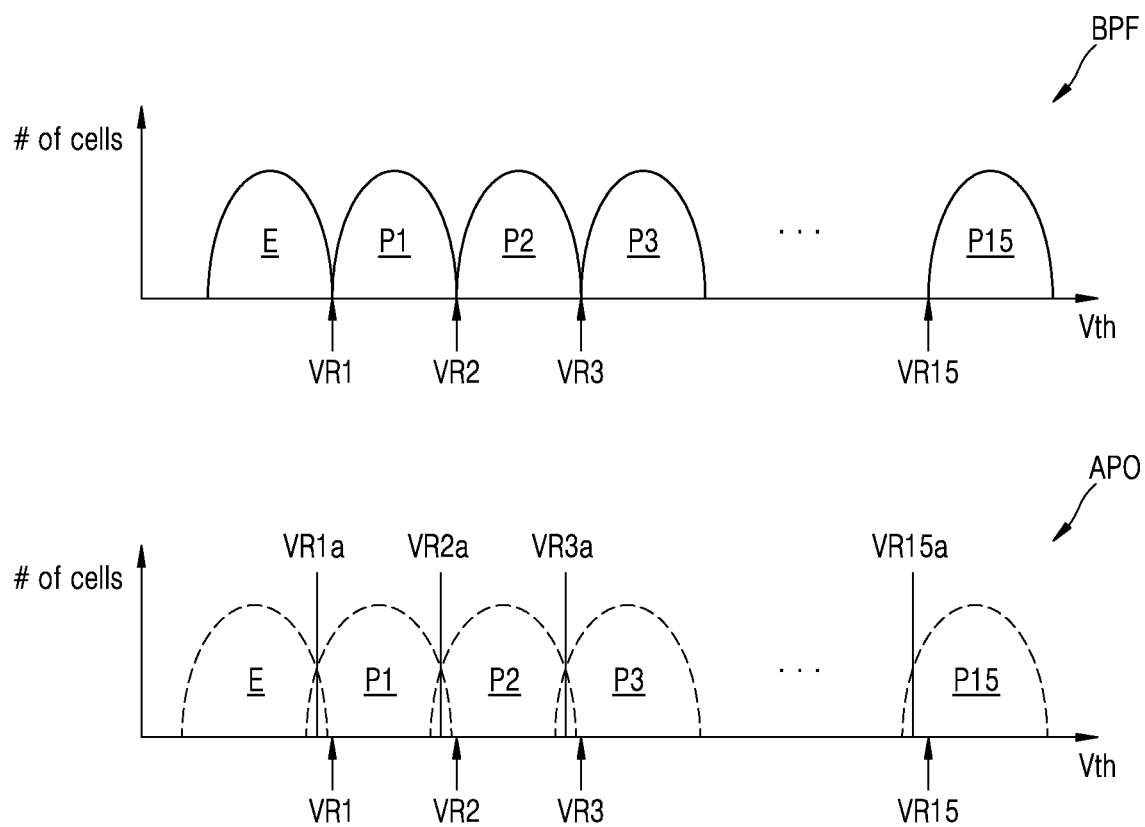
FIG. 6 is a diagram showing an example of a distribution change due to deterioration of memory cells included in a non-volatile memory of FIGS. 3A and 3B.

FIG. 6 is a diagram showing an example of a distribution change due to deterioration of memory cells included in a non-volatile memory of FIGS. 3A and 3B.

Referring to FIG. 6, in an initial distribution BPF and a modified distribution APO, the horizontal axis represents a threshold voltage Vth and the vertical axis represents the number of memory cells. For example, when a memory cell is a quad level cell (QLC) programmed with four bits of data, the memory cell may have one of an erase state E and first to fifteenth program states P1 to P15. The initial distribution BPF may be a distribution of memory cells before a storage device is powered off, and the modified distribution APO may be a distribution of the memory cells after the storage device is powered on from the power-off state. Although FIG. 6 shows a case where the memory cell is a QLC, the inventive concept is not limited thereto and may be applied to a single level cell (SLC) or other multi level cells (MLC, TLC, etc.).

The storage device before power-off may use first to fifteenth pre-free read levels VR1 to VR15 to identify each of the erase state E and first to fifteenth program states P1 to P15 of memory cells. Each of the first to fifteenth pre-free read levels VR1 to VR15 may be a voltage level for identifying a corresponding program state from among the first to fifteenth program states P1 to P15. For example, a first pre-read level VR1 may be a voltage level for identifying a first program state P1, and a fifteenth pre-read level VR15 may be a voltage level for identifying a fifteenth program state P15.

When the storage device is powered off, the memory cells of the storage device may be degraded, and the threshold voltages of degraded memory cells may be changed from those of the initial distribution BPF and constitute the modified distribution APO. In detail, as the power-off period of the storage device increases, charges stored in charge storage layers of memory cells may leak to a substrate. As a result, the threshold voltage of the memory cells may gradually decrease, and distributions of the erase state E and first to fifteenth program states P1 to P15 of the memory cells may be gradually widened. At this time, in the case of performing a read operation on degraded memory cells by using the first to fifteenth pre-free read levels VR1 to VR15, read errors may occur for some memory cells programmed to the program states P1 to P15. For example, if the threshold voltage of a first memory cell has a level indicative of an erase state, and then the memory device is powered off for a certain amount of time and then powered on, the threshold voltage may change to a level indicative of the first program state P1, thereby causing a read error.

In a comparative example, a read retry operation can be performed to modify a read level to eliminate the read error. A storage device may execute firmware-based recovery code to perform the read retry operation. However, it may take a considerable amount of time to execute the recovery code, and thus, the performance of the storage device may be deteriorated.

On the other hand, according to a present exemplary embodiment of the inventive concept, when a storage device is powered on from the power-off state, the storage device receives power-off time information, which is information indicating a time point at which the storage device is powered off, and power-on time information, which is information indicating a time point at which the storage device is powered on, from a host. The storage device may include a read level look-up table including information indicating read levels according to power-off periods. For example, the read level look-up table could include a first read level (e.g., a voltage level) for a first power-off period and a second read level different from the first read level for a second power-off different from the first power-off period. The storage device may directly calculate a power-off period and determine modified read levels (e.g., VR1a to VR15a) corresponding to the calculated power-off period. Therefore, since the storage device does not need to perform a read retry operation to read data, the time elapsed for a read operation after being powered on may be reduced. For example, based on the calculated power-off period, the first pre-free read level VR1 could be changed to a different first read level VR1a, the second pre-free read level VR1 could be changed to a different second read level VR2a, etc.

Figure 7A:
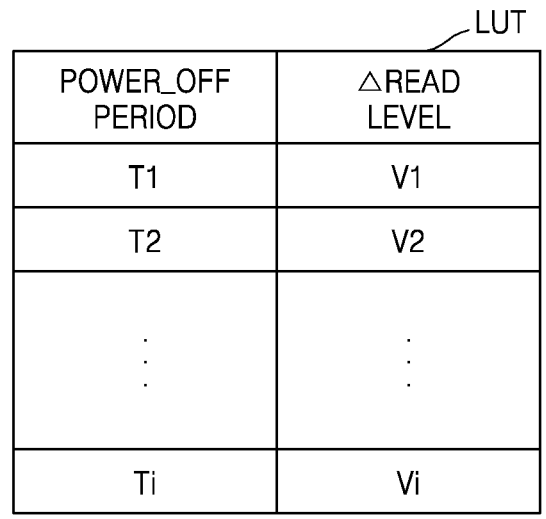
FIGS. 7A and 7B are diagrams showing a read level look-up table corresponding to a threshold voltage distribution variation of FIG. 6, according to an exemplary embodiment of the inventive concept.
Figure 7B:
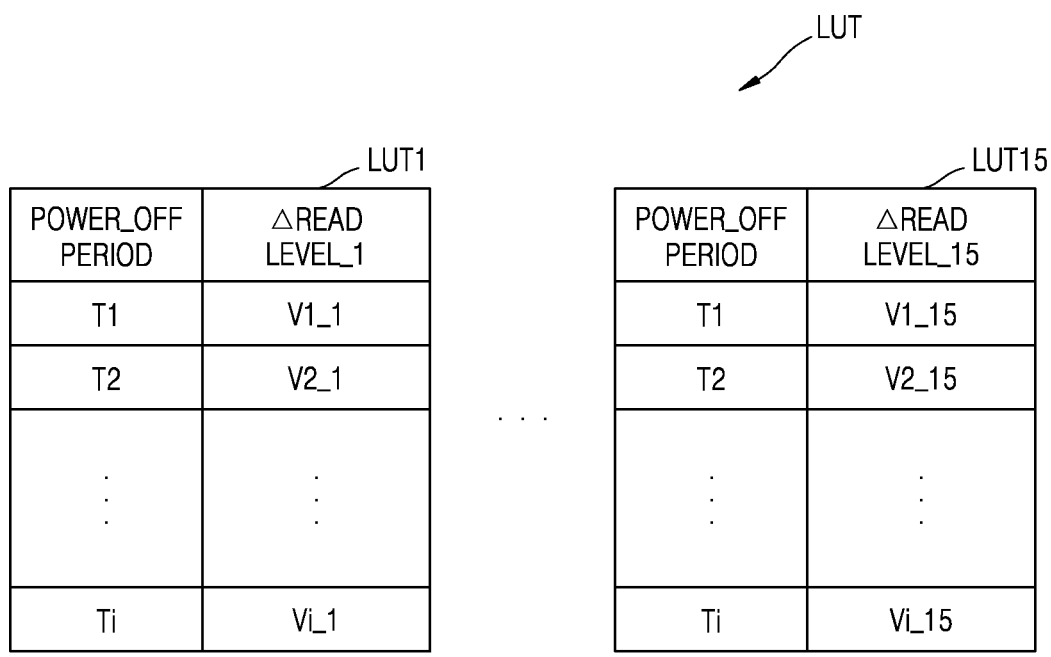

FIGS. 7A and 7B are diagrams showing embodiments of a read level look-up table corresponding to a threshold voltage distribution variation of FIG. 6, according to exemplary embodiments of the inventive concept.

Referring to FIGS. 6 and 7A, information indicating changes of the first to fifteenth pre-free read levels VR1 to VR15 according to power-off periods of a storage device may be stored in the read level look-up table LUT. For example, when the power-off period is equal to or less than a first time Ti, the storage device may reduce the first to fifteenth pre-free read levels VR1 to VR15 by a first voltage V1. When the power-off period is greater than the first time T1 and is equal to or less than a second time T2, the storage device may reduce the first to fifteenth pre-free read levels VR1 to VR15 by a second voltage V2. When the power-off period is greater than an (i−1)-th time T(i−1) and is equal to or less than an i-th time Ti, the storage device may reduce the first to fifteenth pre-free read levels VR1 to VR15 by an i-th voltage Vi. Here, i may be 3 or a greater natural number. In an embodiment, the voltages V1-Vi differ from one another.

In an exemplary embodiment, the longer the power-off period is, the larger the value between a pre-read level and a modified read level. In other words, the second voltage V2 may be greater than the first voltage V1, and the i-th voltage Vi may be greater than the second voltage V2. In other words, as the power-off period increases, a read level for reading the same program state may be reduced.

In an exemplary embodiment, when the power-off periods are the same, the degrees to which the first to fifteenth pre-free read levels VR1 to VR15 are changed are equal to one another. In other words, the same read level look-up table LUT may be applied to change the first to fifteenth pre-free read levels VR1 to VR15 to first to fifteenth modified read levels VR1a to VR15a. For example, when the power-off period of the storage device 100 is less than the first time Ti, a first modified read level VR1a may be formed to be decreased from the first pre-read level VR1 by the first voltage V1 and a fifteenth modified read level VR15a may be formed to be decreased from the fifteenth pre-read level VR15 by the first voltage V1.

Referring to FIGS. 6 and 7B, the read level look-up table LUT may include first to fifteenth read level look-up tables LUT1 to LUT15. Each of the first to fifteenth read level look-up tables LUT1 to LUT15 may store information indicating a change of a corresponding read level from among first to fifteenth pre-free read levels. For example, a first read level look-up table LUT1 may store information indicating a change of the first pre-read level VR1 according to the power-off period of a storage device. A fifteenth read level look-up table LUT15 may store information regarding a change of the fifteenth pre-read level VR15 according to the power-off period of the storage device.

For example, the storage device may reduce the first pre-read level VR1 by a first voltage V1_1 when the power-off period is equal to or less than the first time Ti, reduce the first pre-read level VR1 by a second voltage V2_1 when the power-off period is greater than the first time T1 and equal to or less than the second time T2, and reduce the first pre-read level VR1 by an i-th voltage Vi_1 when the power-off period is greater than an (i−1)-th time T(i−1) and equal to or less than an i-th time Ti.

Also, the storage device may reduce the fifteenth pre-read level VR15 by a first voltage V1_15 when the power-off period is equal to or less than the first time T1, reduce the fifteenth pre-read level VR1 by a second voltage V2_15 when the power-off period is greater than the first time T1 and equal to or less than the second time T2, and reduce the fifteenth pre-read level VR1 by an i-th voltage Vi_15 when the power-off period is greater than the (i−1)-th time T(i−1) and equal to or less than the i-th time Ti.

In an exemplary embodiment, when the power-off periods are the same, the degrees to which at least some of the first to fifteenth pre-free read levels VR1 to VR15 are changed may differ. In an exemplary embodiment, a degree to which a pre-read level for determining a relatively high program state varies, increases depending on the power-off period. For example, the higher the program state, the greater the shift of the threshold voltage distribution over the power-off period. For example, when the power-off period is equal to or less than the first time Ti, the first voltage V1_1, which is the difference between the first pre-read level VR1 and the first modified read level VR1a, is less than the first voltage V1_15, which is the difference between the fifteenth pre-read level VR15 and the fifteenth modified read level VR15a.

Figure 8:
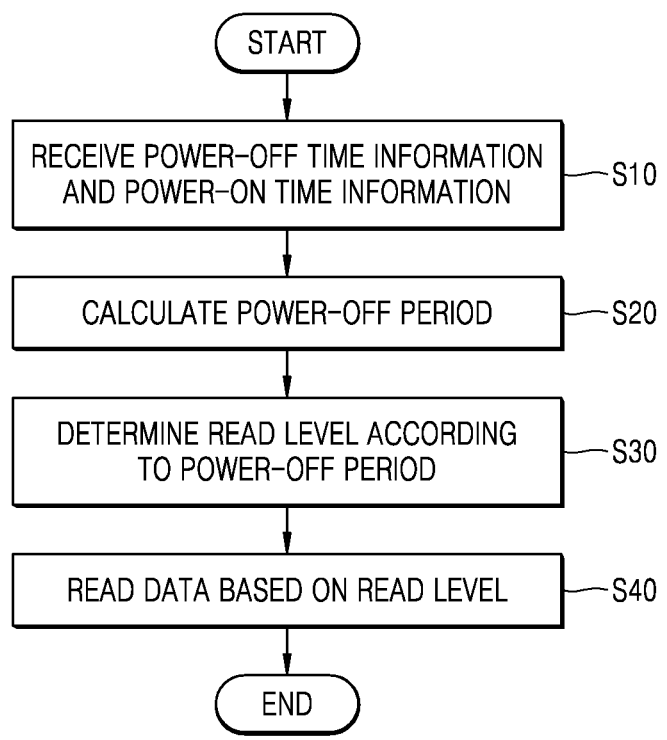
FIG. 8 is a flowchart of a method of operating a storage device, according to an exemplary embodiment of the inventive concept.

FIG. 8 is a flowchart of a method of operating a storage device, according to an exemplary embodiment of the inventive concept.

Referring to FIGS. 1 and 8, the method of operating a storage device, according to the present embodiment, may be performed in a time-series manner in the storage device 100 of FIG. 1.

In operation S10, the storage device 100 receives the power-off time information CT_OFF and the power-on time information CT_ON from the host 200. In an exemplary embodiment, the storage device 100 receives the power-off time information CT_OFF and the power-on time information CT_ON from the host 200, when the storage device 100 is switched from the power-off state to the power-on state. The storage device 100 may store a power-off time within the power-off time information CT_OFF and a power-on time within the power-on time information CT_ON as time stamps.

In operation S20, the storage device 100 calculates a power-off period of the storage device 100 based on the stored time stamps. For example, the difference between the power-on time and the power-off time may be calculated based on a power-off time stamp and a power-on time stamp.

In operation S30, the storage device 100 determines a read level according to a calculated power-off period. The storage device 100 may determine the read level based on a pre-stored read level look-up table. When memory cells included in the memory cell array 121 are MLCs (e.g., QLCs), a plurality of read levels may be determined in operation S30.

In operation S40, the storage device 100 performs a data read operation based on the determined read level. The storage device 100 according to the inventive concept receives the power-off time information CT_OFF and the power-on time information CT_ON from the outside, that is, the host 200, and considers them in a read operation, and thus, the accuracy of the read operation may be improved.

Figure 9:
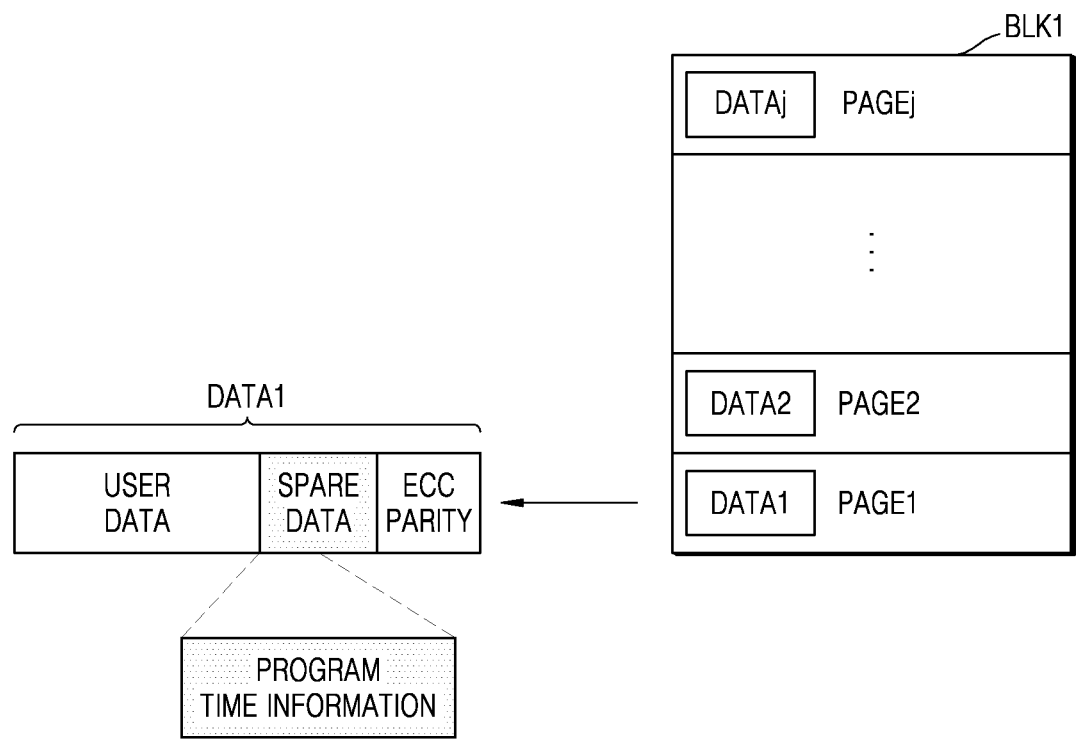
FIG. 9 is a diagram showing the structure of data stored in pages constituting the first memory block of FIGS. 3A and 3B.

FIG. 9 is a diagram showing the structure of data stored in pages constituting the first memory block BLK1 of FIGS. 3A and 3B.

Referring to FIG. 9, a first memory block BLK1 includes a plurality of pages PAGE1 to PAGEj. Each of the pages PAGE1 to PAGEj may correspond to a unit for programming or reading data in one memory block.

First data DATA1 may be stored in a first page PAGE1, second data DATA2 may be stored in a second page PAGE2, and j-th data DATAj may be stored in a j-th page PAGEj. In this case, j may be 3 or a greater natural number.

Each of the first data DATA1, the second data DATA2, and the j-th data DATAj may include user data, spare data, and an ECC parity. In an example embodiment, each of the first data DATA1, the second data DATA2, and the j-th data DATAj may be data of an ECC unit (or an ECC chunk).

Spare data may include metadata indicating attributes of the user data, and program time information may be stored in the spare data. For example, information indicating a time point at which the first data DATA1 is programmed to the first page PAGE1 may be stored as a time stamp in the spare data.

An ECC parity may be used to correct errors generated in data included in an ECC unit. In an example embodiment, errors generated in one or more bits during reading of the first data DATA1 stored in the first page PAGE1 may be corrected through an error correction operation using an ECC parity.

Although the description given above with reference to FIG. 9 relates to the first data DATA1 stored in the first page PAGE1 of the first memory block BLK1, the description may be applied to other data stored in other pages of the first memory block BLK1 in the same regard, and the same description may also be applied to memory blocks other than the first memory block BLK1.

Figures 10A, 10B:
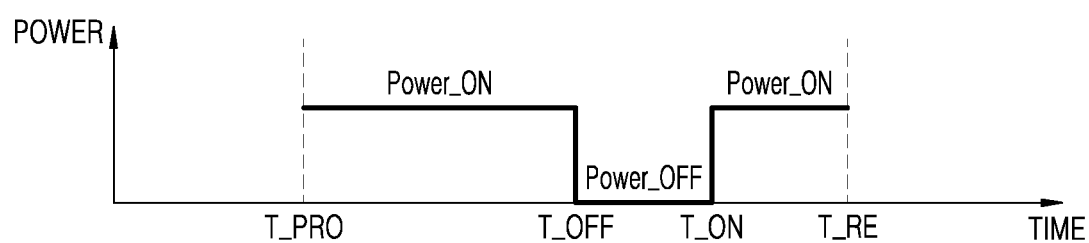
FIG. 10A is a diagram showing an auxiliary look-up table stored in a storage device according to an exemplary embodiment of the inventive concept.
FIG. 10B is a diagram for describing an exemplary time elapsed after first data of FIG. 9 is programmed on a first page.

FIG. 10A is a diagram showing an auxiliary look-up table stored in a storage device according to an exemplary embodiment of the inventive concept. FIG. 10B is a diagram for describing the time elapsed after first data of FIG. 9 is programmed to a first page.

Referring to FIG. 10A, an auxiliary look-up table LUTa may be further stored in a storage device. The auxiliary look-up table LUTa may store information indicating read levels according to time elapsed after data is programmed during a power-on period. For example, the auxiliary look-up table LUTa may include information indicating changes of pre-free read levels (e.g., the first to fifteenth pre-free read levels VR1 to VR15 of FIG. 6) according to time elapsed after data is programmed during the power-on period. In an exemplary embodiment, the auxiliary look-up table LUTa may be stored in a non-volatile memory (e.g., 120 of FIG. 1). Alternatively, in another exemplary embodiment, the auxiliary look-up table LUTa may be stored in a storage controller (e.g., 110 of FIG. 1).

For example, the storage device may reduce a read level from a pre-read level by a first voltage V1a when the time elapsed after data is programmed in the power-on period is equal to or less than a first time T1a, may reduce the read level from the pre-read level by a second voltage V2a when the time elapsed after data is programmed in the power-on period is greater than the first time T1a and equal to or less than a second time T2a, and may reduce the read level from the pre-read level by a k-th voltage Vka when the time elapsed after data is programmed in the power-on period is greater than a (k−1)-th time T(k−1)a and equal to or less than a k-th time Tka. In this case, k may be 3 or a greater natural number.

In an exemplary embodiment, when times elapsed after data is programmed in the power-on period are the same, the degrees to which pre-free read levels (e.g., VR1 to VR15 in FIG. 6) for determining different program states are modified may be the same. In another exemplary embodiment, when times elapsed after data is programmed in the power-on period are the same, the degrees to which at least some of pre-free read levels (e.g., VR1 to VR15 in FIG. 6) for determining different program states are modified may differ. In an exemplary embodiment, a degree to which a pre-read level for determining a relatively high program state varies may increase.

Referring to FIGS. 9, 10A, and 10B, the storage device calculates the time T_PRO-T_RE elapsed after the first data DATA1 is programmed, based on program time information stored in the spare data of the first data DATA1. For example, the time elapsed after the first data DATA1 is programmed may refer to the time between a time point T_PRO at which the first data DATA1 is programmed and a time point T_RE at which the first data DATA1 is read. The elapsed time may include a Power OFF period between a first time during which the first data DATA is programmed and a second time during which the first data DATA1 is read.

The time T_PRO-T_RE elapsed after data is programmed may be calculated by comparing a current time provided by a timer (e.g., 114 of FIG. 2) of the storage controller with the program time information stored in the spare data. The timer 114 of the storage controller may be reset in the power-off state, but new time information considering the power-off period may be set based on time information received from the host. For example, if the timer 114 had created a count representing an elapsed time that failed to reach a reference time before a powering off of the storage device 100, and the timer 114 is reset due to the powering off, the timer 114 could start the count at the time of the power-off period derived from timestamps received from the host after a powering on of the storage device 100.

After the first data DATA1 is programmed, the storage device may be powered off at a power-off time point T_OFF and powered on at a power-on time point T_ON. The storage device may calculate the power-off period between the power-off time point T_OFF and the power-on time point T_ON and calculate a change of a read level due to a calculated power-off period by using the read level look-up table LUT of FIG. 7A or 7B.

Also, the storage device may calculate a period from the time point T_PRO at which the first data DATA1 is programmed to the power-off time point T_OFF and a period from the power-on time point T_ON to the time point T_RE at which the first data DATA1 is read and may calculate a change of a read level according to time elapsed after data is programmed in the power-on period by using the auxiliary look-up table LUTa of FIG. 10A.

Therefore, the storage device according to an exemplary embodiment of the inventive concept may determine a read level for a read operation by considering both a change of the threshold voltage distribution of memory cells due to power-off and a change of the threshold voltage distribution of the memory cells as time passes after data is programmed in the power-on period. Thus, the storage device may have reduced errors in a read operation.

Figure 11:
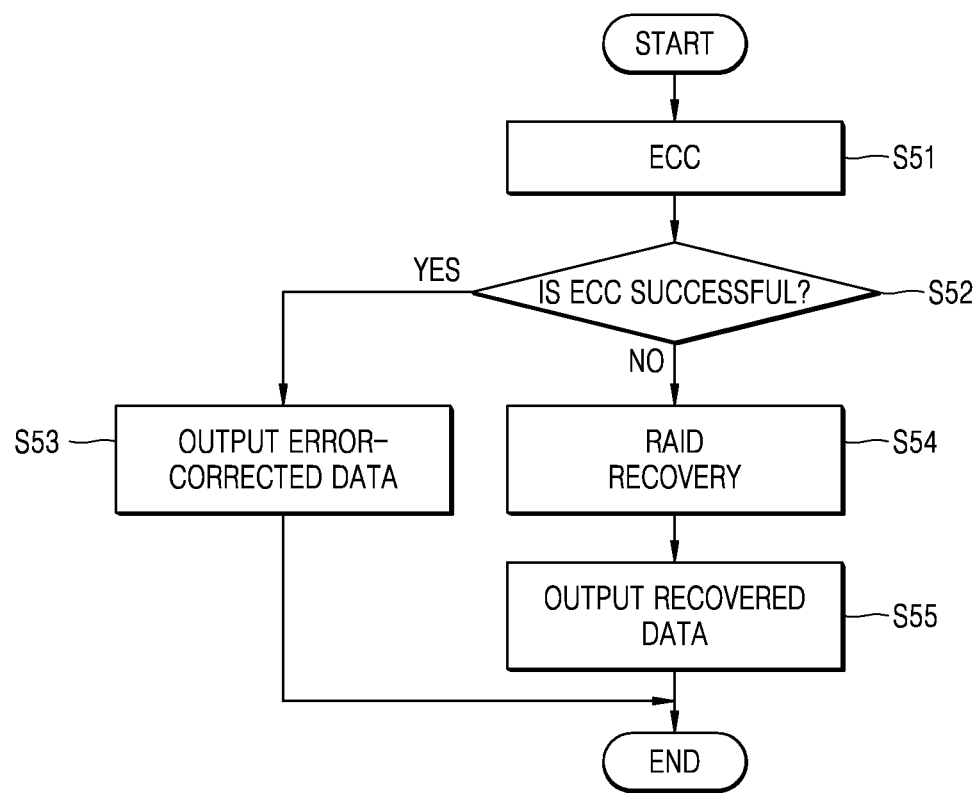
FIG. 11 is a flowchart of a method of operating a storage device, according to an exemplary embodiment of the inventive concept.

FIG. 11 is a flowchart of a method of operating a storage device, according to an exemplary embodiment of the inventive concept.

Referring to FIGS. 1 and 11, the method of operating a storage device, according to the present embodiment, may be performed in a time-series manner in the storage device 100 of FIG. 1. In an exemplary embodiment, operation S50, which is the method of FIG. 11, may be performed after operation S40 of FIG. 8.

In operation S51, when a read request is received from the host 200, the storage device 100 reads user data requested to be read and a corresponding ECC parity and performs an error correction operation on the read user data using the ECC parity. For example, the user data and the ECC parity may be read together from the first page (e.g., PAGE 1 of FIG. 9). In operation S52, the storage device 100 determines whether the error correction operation is successful. When the error correction operation is successful, in operation S53, the storage device 100 outputs error-corrected data.

When an ECC failure for the first data DATA1 of the first page PAGE 1 is detected, in operation S54, the storage device 100 performs a RAID recovery operation. The storage device 100 may read data and a RAID parity constituting a RAID stripe from cell regions other than a first cell area including the first page PAGE1 and perform a RAID recovery operation by using the read data and the read RAID parity. In operation S55, the storage device 100 outputs data recovered through the RAID recovery operation.

Since the storage device 100 according to at least one embodiment of the inventive concept adjusts a read level according to a power-off period, read errors due to retention may be reduced. Therefore, a read error due to retention that makes an error correcting operation and a RAID recovery operation using an ECC parity impossible may be prevented. In other words, the data recovery range in which an error correction operation and a RAID recovery operation are performed may be widened.

Figure 12:
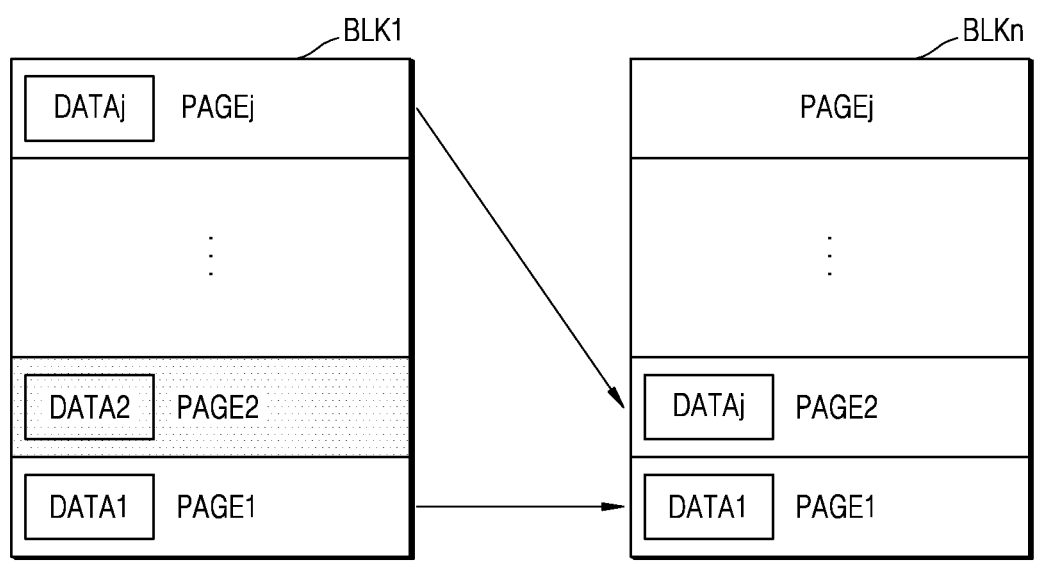
FIG. 12 is a diagram for describing a read reclaim operation of a storage device according to an exemplary embodiment of the inventive concept.
Figure 13:
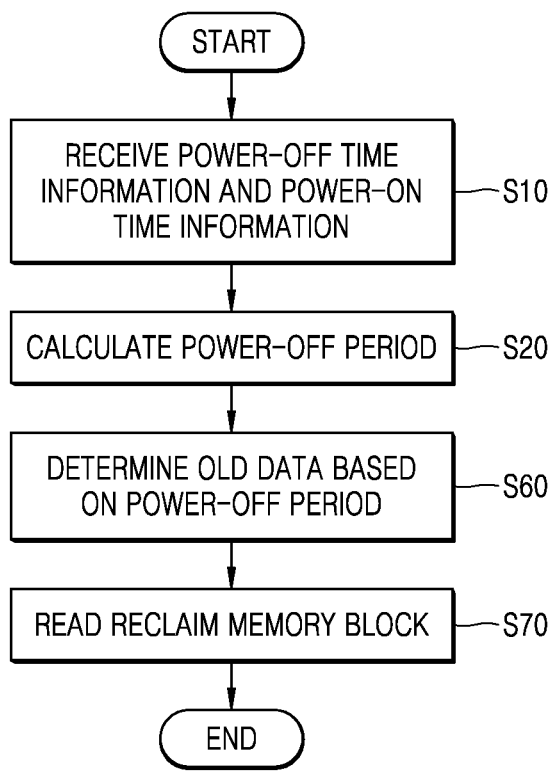
FIG. 13 is a flowchart of a method of operating a storage device, according to an exemplary embodiment of the inventive concept.

FIG. 12 is a diagram for describing a read reclaim operation of a storage device according to an exemplary embodiment of the inventive concept. FIG. 13 is a flowchart of a method of operating a storage device according to an exemplary embodiment of the inventive concept.

Referring to FIGS. 1, 12, and 13, the method of operating a storage device according to the present embodiment may be performed in a time-series manner in the storage device 100 of FIG. 1.

In operation S10, the storage device 100 receives the power-off time information CT_OFF and the power-on time information CT_ON from the host 200. The storage device 100 may store a power-off time within the power-off time information CT_OFF and a power-on time within the power-on time information CT_ON as time stamps. In operation S20, the storage device 100 calculates a power-off period of the storage device 100 based on stored time stamps.

In operation S60, the storage device 100 determines old data according to the power-off period. For example, the storage device 100 may determine second data DATA2 stored in a second page PAGE2 from among the pages PAGE1 to PAGEj included in the first memory block BLK1 is old data (i.e., invalid data).

Based on program time information of first to j-th data DATA1 to DATAj of the first memory block BLK1, the storage device 100 may calculate time elapsed after the first to j-th data DATA1 to DATAj are programmed, respectively. A power-off period may be included in the time after each of the first to j-th data DATA1 to DATAj is programmed. In an exemplary embodiment, the storage device 100 compares an time elapsed after each of the first to j-th data DATA1 to DATAj is programmed with a reference time and, when an elapsed time exceeds the reference time, determines corresponding data as old data. For example, the storage device 100 may determine that the time elapsed after the second data DATA2 stored in the second page PAGE2 is programmed exceeds the reference time and determine the second data DATA2 as old data. In other words, the reference time may be the upper limit time that the storage device guarantees validity of programmed data.

In operation S60, the storage device 100 performs a read reclaim operation on the first memory block BLK1 to which the second data DATA2 is programmed. Here, the "read reclaim" refers to an operation for moving data of the first memory block BLK1 to another block, e.g., an n-th memory block BLKn, deleting the data of the first memory block BLK1, and reusing the first memory block BLK1. In detail, valid pages stored in the first memory block BLK1 may be read and the read data from the valid pages may be programmed to another block, that is, the n-th memory block BLKn. For example, the first data DATA1 of the first memory block BLK1 may be programmed to the first page PAGE1 of the n-th memory block BLKn, and the j-th data DATAj of the first memory block BLK1 may be programmed to the second page PAGE2 of the n-th memory block BLKn. Therefore, the first memory block BLK1 in a mapping table may be changed to the n-th memory block BLKn, and a page address may be changed according to the number of valid pages in the first memory block BLK1.

Accordingly, the storage device 100 according to at least embodiment of the inventive concept may determine old data as invalid data by calculating time elapsed after the old data is programmed, without an error correction operation or a RAID recovery operation. Thus, the storage device 100 may reduce time needed for a read reclaim operation.

Figure 14:
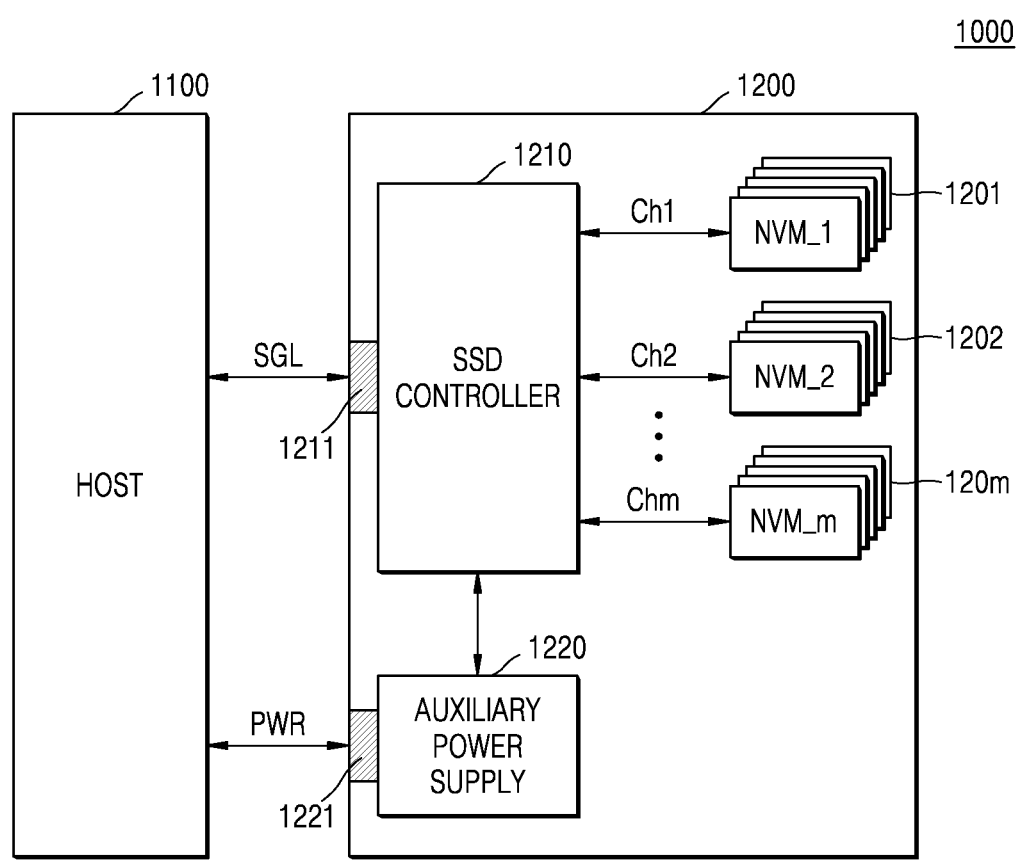
FIG. 14 is a block diagram showing an example of applying a storage device according to an exemplary embodiment of the inventive concept to a solid state drive (SSD).

FIG. 14 is a block diagram showing an example of applying a storage device according to an exemplary embodiment of the inventive concept to a solid state drive (SSD).

Referring to FIG. 14, an SSD system 1000 includes a host 1100 and an SSD 1200. The SSD system 1000 may be the storage system 10 of FIG. 1, the host 1100 may be the host 200 of FIG. 1, and the SSD 1200 may be the storage device 100 of FIG. 1.

The SSD 1200 may exchange signals with the host 1100 through a signal connector 1211 and may receive power through a power connector 1221. The SSD 1200 may include a plurality of flash memories 1201 to 120*m*, an SSD controller 1210, and an auxiliary power supply 1220. The flash memories 1201 to 120*m* may be used as storage media for the SSD 1200. The SSD 1200 may include a non-volatile memory device like a PRAM, an MRAM, a ReRAM, or a FRAM other than a flash memory. The flash memories 1201 to 120*m* may be connected to the SSD controller 1210 through a plurality of channels CH1 to Chm. One channel may be connected to one or more flash memories. Flash memories connected to one channel may be connected to the same data bus.

The SSD controller 1210 may exchange signals SGL with the host 1100 through the signal connector 1211. Here, the signals SGL may include commands, addresses, data, and the like. The SSD controller 1210 may write data to a corresponding flash memory or read data from the corresponding flash memory according to a command of the host 1100.

The auxiliary power supply 1220 may be connected to the host 1100 via the power connector 1221. The auxiliary power supply 1220 may receive power PWR from the host 1100 and charge a battery or capacitor using the received power PWR. Meanwhile, the auxiliary power supply 1220 may be located within the SSD 1200 or may be located outside the SSD 1200. For example, the auxiliary power supply 1220 may be located on a mainboard and may provide auxiliary power to the SSD 1200.

When the SSD 1200 according to an exemplary embodiment the inventive concept receives the power PWR from the host 1100 through the power connector 1221 in the power-off state and is then powered on, the SSD 1200 may receive power-off time information and power-on time information via the signal connector 1211. The SSD 1200 may calculate a power-off period based on the power-off time information and the power-on time information and determine a read level based on the power-off period or perform a read reclaim operation. Therefore, the SSD 1200 may reduce read errors for a read operation and reduce time needed for a read reclaim operation.

While the inventive concept has been particularly shown and described with reference to embodiments thereof, it will be understood that various changes in form and details may be made therein without departing from the spirit and scope of the disclosure.

What is claimed is:

1. A storage device comprising:
a non-volatile memory comprising a plurality of memory blocks; and
a storage controller configured to control a read operation of the non-volatile memory,
wherein the storage controller receives power-off time information from a host indicating a time point at which the storage device is powered off, and receives power-on time information from the host indicating a time point at which the storage device is powered on, when the storage device is switched from a power-off state to a power-on state,
wherein the storage controller stores a power-off time stamp corresponding to the power-off time point and a power-on time stamp corresponding to the power-on time point in the non-volatile memory,
wherein the host is an external source of the storage device.

2. The storage device of claim 1,
wherein the non-volatile memory stores a read level look-up table comprising information on read levels according to power-off periods, and
wherein the storage controller adjusts the at least one read level to be used in the read operation based on the read level look-up table, the power off time stamp, and the power on time stamp.

3. The storage device of claim 2,
wherein the non-volatile memory stores an auxiliary look-up table comprising information indicating read levels according to time elapsed after data is programmed in a power-on period, and
the storage controller adjusts the at least one read level additionally based on the auxiliary look-up table.

4. The storage device of claim 1,
wherein the non-volatile memory stores a read level look-up table comprising information on read levels according to power-off periods, and wherein the non-volatile memory adjusts the at least one read level to be used in the read operation based on the read level look-up table, the power off time stamp, and the power on time stamp.

5. The storage device of claim 1, wherein the storage controller determines whether data programmed to the non-volatile memory is old data based on the power-off time stamp and the power-on time stamp, and performs a read reclaim operation on a memory block to which the old data is programmed from among the memory blocks.

6. The storage device of claim 1, wherein the storage controller receives the power-off time information and the power-on time information after the storage device is provided external power and is switched to the power-on state.

7. The storage device of claim 1, wherein the storage controller performs an error correction operation using an error correction code (ECC) parity of data read from the non-volatile memory, and wherein the storage controller performs a redundant array of inexpensive disk (RAID) recovery operation by using a RAID parity of the read data when error correction operation fails.

8. The storage device of claim 1, wherein the storage device includes a solid state drive (SSD).

9. The storage device of claim 1, wherein the non-volatile memory comprises quad-level cells each programmed with 4 bits of data.

10. A storage device comprising:
a non-volatile memory comprising a plurality of memory blocks; and
a storage controller configured to control a read operation of the non-volatile memory performed by using at least one read level,
wherein the storage controller receives power-off time information from a host indicating a time point at which the storage device is powered off, and receives power-on time information from the host indicating a time point at which the storage device is powered on, wherein the host is an external source of the storage device, and
wherein the storage controller controls the read operation by using a power-off period calculated based on the power-off time information and the power-on time information.

11. The storage device of claim 10, wherein the non-volatile memory stores a read level look-up table comprising information on read levels according to the power-off period, and the storage controller determines the at least one read level by using the read level look-up table.

12. The storage device of claim 10, wherein the storage controller determines a plurality of different read levels according to the power-off period, and wherein values of at least some read levels from among the read levels different from one another are changed differently by the power-off period.

13. The storage device of claim 12, wherein the higher the read levels different from one another are, the larger the values at which the read levels are changed by the power-off period become.

14. The storage device of claim 10, wherein the storage controller determines a plurality of different read levels according to the power-off period, and wherein values of the read levels different from one another changed by the power-off period are identical to one another.

15. The storage device of claim 10, wherein the storage controller stores a read level look-up table comprising information indicating read levels according to the power-off period and determines a read level by using the read level look-up table.

16. The storage device of claim 10, wherein the non-volatile memory stores an auxiliary look-up table comprising information indicating read levels according to time elapsed after data is programmed in a power-on period, and the storage controller determines the at least one read level by using the auxiliary look-up table.

17. The storage device of claim 10, wherein the storage controller determines whether data programmed to the non-volatile memory is old data based on the power-off period, and wherein the storage controller performs a read reclaim operation on a memory block to which the old data is programmed from among the memory blocks.

18. A storage controller comprising:
a memory configured to store a power-off time stamp, a power-on time stamp, and a read level look-up table comprising information indicating read levels according to power-off periods; and a
processor configured to control a read operation of a non-volatile memory,
wherein the processor stores the power-off time stamp by using input power-off time information indicating a power-off time point, and stores the power-on time stamp by using input power-on time information indicating a power-on time point, and wherein the processor controls the read operation of the non-volatile memory using a power-off period calculated based on the power-off time stamp and the power-on time stamp and the read level look-up table.

19. The storage controller of claim 18, further comprising a timer configured to provide internal time information needed for an operation to the processor, wherein the timer sets the internal time information based on the power-off time stamp and the power-on time stamp.

20. The storage controller of claim 18, wherein the processor controls the read operation of the non-volatile memory, such that the read level for reading a same program state decreases as the power-off period increases.

* * * * *